(12) United States Patent
Han

(10) Patent No.: US 12,274,154 B2
(45) Date of Patent: Apr. 8, 2025

(54) INK DROPLET VOLUME MEASURING APPARATUS AND INK DROPLET VOLUME MEASURING METHOD USING THE SAME, AND THIN FILM LAYER FORMING APPARATUS USING THE MEASURING APPARATUS, AND MANUFACTURING METHOD OF DISPLAY APPARATUS USING THE THIN FILM LAYER FORMING APPARATUS

(71) Applicant: Samsung Display Co., Ltd., Yongin-si (KR)

(72) Inventor: Jeongwon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/605,154

(22) Filed: Mar. 14, 2024

(65) Prior Publication Data

US 2024/0251648 A1 Jul. 25, 2024

Related U.S. Application Data

(62) Division of application No. 16/794,102, filed on Feb. 18, 2020, now abandoned.

(30) Foreign Application Priority Data

Jun. 17, 2019 (KR) ........................ 10-2019-0071767

(51) Int. Cl.
*B41J 2/45* (2006.01)
*B41J 2/045* (2006.01)
(Continued)

(52) U.S. Cl.
CPC .......... *H10K 71/00* (2023.02); *B41J 2/04535* (2013.01); *B41J 2/0456* (2013.01);
(Continued)

(58) Field of Classification Search
CPC .. H01L 51/56; H01L 51/0005; B41J 2/04535; B41J 2/0456; B41J 2/04593
See application file for complete search history.

(56) References Cited

U.S. PATENT DOCUMENTS 8,654,352 B1 2/2014 Deng et al.
9,144,820 B2 9/2015 Ikushima
(Continued)

FOREIGN PATENT DOCUMENTS

CN 103575218 2/2014
CN 107004699 8/2017
(Continued)

OTHER PUBLICATIONS

Chinese Office Action for Chinese Patent Application No. 202010119840.5, dated Mar. 30, 2024.
(Continued)

*Primary Examiner* — Jarrett J Stark
(74) *Attorney, Agent, or Firm* — KILE PARK REED & HOUTTEMAN PLLC

(57) ABSTRACT

An ink droplet volume measuring apparatus including: a substrate on which an ink droplet is dropped; a chromatic confocal sensor irradiating light having a plurality of wavelengths to the ink droplet dropped on the substrate and scanning the ink droplet; and a controller calculating a three-dimensional shape of the ink droplet from a signal scanned by the chromatic confocal sensor.

5 Claims, 9 Drawing Sheets

(51) Int. Cl.
  *G01B 11/24* (2006.01)
  *H10K 71/00* (2023.01)
  *H10K 71/13* (2023.01)
  *H10K 50/115* (2023.01)
  *H10K 59/38* (2023.01)
  *H10K 71/50* (2023.01)

(52) U.S. Cl.
  CPC ........... *B41J 2/04593* (2013.01); *G01B 11/24* (2013.01); *B41J 2202/03* (2013.01); *H10K 50/115* (2023.02); *H10K 59/38* (2023.02); *H10K 71/135* (2023.02); *H10K 71/50* (2023.02)

(56) References Cited

U.S. PATENT DOCUMENTS

| | | | |
|---|---|---|---|
| 10,388,224 B2 | 8/2019 | Kim et al. | |
| 2006/0045814 A1* | 3/2006 | Zhang | G02B 21/0076 422/400 |
| 2007/0200492 A1 | 8/2007 | Cok et al. | |
| 2010/0208486 A1* | 8/2010 | Gladnick | G01B 11/026 362/84 |
| 2013/0213930 A1* | 8/2013 | Wakamatsu | B82Y 40/00 216/41 |
| 2014/0131313 A1* | 5/2014 | Wakamatsu | G03F 7/0002 703/2 |
| 2014/0170214 A1* | 6/2014 | Scherman | B01J 13/14 424/451 |
| 2015/0346580 A1* | 12/2015 | Williams | G02F 1/353 977/783 |
| 2016/0377956 A1 | 12/2016 | Williams | |
| 2016/0379800 A1* | 12/2016 | Ohtsu | H01J 37/32541 216/13 |
| 2017/0050010 A1* | 2/2017 | McAllister | A61M 37/0015 |
| 2017/0157949 A1 | 6/2017 | Madigan et al. | |
| 2017/0274652 A1* | 9/2017 | Tamai | B41J 2/1629 |
| 2018/0257099 A1 | 9/2018 | Miyazaki et al. | |
| 2018/0283856 A1 | 10/2018 | Suemasu et al. | |
| 2019/0009456 A1* | 1/2019 | Biskop | B29D 11/00951 |
| 2019/0210052 A1 | 7/2019 | Baker et al. | |
| 2019/0217545 A1* | 7/2019 | Eller | B29C 64/264 |
| 2020/0395543 A1* | 12/2020 | Han | B41J 2/04535 |

FOREIGN PATENT DOCUMENTS

| | | |
|---|---|---|
| CN | 107768278 | 3/2018 |
| CN | 109476079 | 3/2019 |
| JP | 1993-149769 | 6/1993 |
| JP | 2015-125125 | 7/2015 |
| KR | 10-2013-0060508 | 6/2013 |
| KR | 10-1368486 | 3/2014 |
| KR | 10-2016-0083420 | 7/2016 |
| KR | 10-1641115 | 7/2016 |
| KR | 10-1701904 | 2/2017 |
| KR | 10-2017-0051466 | 5/2017 |
| KR | 10-2017-0096583 | 8/2017 |
| KR | 10-1818695 | 1/2018 |
| KR | 10-2018-0021647 | 3/2018 |
| KR | 10-2018-0040038 | 4/2018 |
| KR | 10-2018-0091883 | 8/2018 |
| KR | 10-2018-0102489 | 9/2018 |
| KR | 10-2018-0112687 | 10/2018 |
| KR | 10-2018-0128524 | 12/2018 |
| KR | 10-2019-0000602 | 1/2019 |

OTHER PUBLICATIONS

Chinese Office Action for Chinese Patent Application No. 202010119840.5, dated Jan. 8, 2025.

* cited by examiner

INK DROPLET VOLUME MEASURING APPARATUS AND INK DROPLET VOLUME MEASURING METHOD USING THE SAME, AND THIN FILM LAYER FORMING APPARATUS USING THE MEASURING APPARATUS, AND MANUFACTURING METHOD OF DISPLAY APPARATUS USING THE THIN FILM LAYER FORMING APPARATUS

CROSS-REFERENCE TO RELATED APPLICATION

This is a divisional application of U.S. patent application Ser. No. 16/794,102 filed Feb. 18, 2020 (now pending), the disclosure of which is incorporated herein by reference in its entirety. U.S. patent application Ser. No. 16/794,102 claims priority from and the benefit of Korean Patent Application No. 10-2019-0071767, filed on Jun. 17, 2019, which is hereby incorporated by reference for all purposes as if fully set forth herein.

BACKGROUND

Field

Exemplary embodiments of the invention relate generally to an ink droplet volume measuring apparatus, a method of measuring an ink droplet volume by using the ink droplet volume measuring apparatus, a thin-film layer forming apparatus using the ink droplet volume measuring apparatus, and a method of manufacturing a display apparatus by using the thin-film layer forming apparatus.

Discussion of the Background

A display apparatus, such as an organic light-emitting display, realizes an image by generating light according to a principle in which holes and electrons injected from an anode and cathode recombines in an emission layer to emit light. For example, the display apparatus includes pixels emitting light in one of red, green, and blue colors and exhibits a desired color by utilizing color combinations of the pixels.

To do so, each pixel comprises an organic light-emitting device generating single-colored light such as white or blue, and a quantum dot thin-film layer and a color filter as light-blocking units for converting the single-colored light into a desired color from among red, green, and blue and emit the converted light. In other words, when the organic light-emitting device of each pixel generates a single-colored light, the single-colored light passing through the quantum dot thin-film layer and the color filer is converted into one color from among red, green, and blue and then is emitted. An image of a desired color is realized by utilizing various combinations of colors of light emitted in appropriate colors.

A quantum dot thin-film layer is formed by dropping an ink droplet from an inkjet printer. In this case, an ink droplet that is excessively large may get out of an appropriate position and form a stain, when the ink droplet is too small, the quantum dot thin-film layer may not properly function as a light-blocking unit.

Accordingly, in order to delicately form the quantum dot thin-film layer, it is required that a size of the ink droplet is precisely measured, fed back, and an ejection amount is calibrated. In the related art, a method of measuring a width of a bottom surface of a dropped ink droplet and calculating a volume of the ink droplet as an approximate estimated value from the width of the bottom surface of the dropped ink droplet. However, in the above-mentioned method, a volume and an error of an actual ink droplet inevitably increases, and therefore, the ink droplet may not be precisely controlled.

The above information disclosed in this Background section is only for understanding of the background of the inventive concepts, and, therefore, it may contain information that does not constitute prior art.

SUMMARY

Exemplary embodiments of the invention provide an ink droplet volume measuring apparatus, which is improved to more precisely measure the volume of the actual ink droplet and reflect the volume to be used in control, a method of measuring a volume of the ink droplet, a thin-film layer forming apparatus using the ink droplet volume measuring apparatus, and a method of manufacturing the display apparatus using the thin-film layer forming apparatus.

Additional features of the inventive concepts will be set forth in part in the description which follows and, in part, will be apparent from the description, or may be learned by practice of the inventive concepts.

An exemplary embodiment of the invention provides an ink droplet volume measuring apparatus including: a substrate on which an ink droplet is dropped; a chromatic confocal sensor irradiating light having a plurality of wavelengths to the ink droplet dropped on the substrate and scanning the ink droplet; and a controller calculating a three-dimensional shape of the ink droplet from a signal scanned by the chromatic confocal sensor.

A plurality of the ink droplets may be dropped on the substrate.

The chromatic confocal sensor may scan the plurality of ink droplets, and the controller may calculate a three-dimensional shape for each of the plurality of droplets.

The ink droplet may include nanoparticles.

The ink may include ink for forming a quantum dot thin-film layer.

Another exemplary embodiment of the invention provides a thin-film layer forming apparatus including: an inkjet head including a nozzle dropping an ink droplet; a substrate on which the ink droplet is dropped; a chromatic confocal sensor irradiating light having a plurality of wavelengths to the ink droplet dropped on the substrate and scanning the ink droplet; and a controller feedback-controlling an ejection amount of the nozzle of the inkjet head by calculating the three-dimensional shape of the ink droplet from a signal scanned by the chromatic confocal sensor.

A plurality of the nozzles may be provided to drop a plurality of ink droplets on the substrate.

The chromatic confocal sensor may scan the plurality of ink droplets, and the controller may calculate a three-dimensional shape for each of the plurality of ink droplets to feedback-control the ejection amount of each of the plurality of nozzles.

The ink droplet may include nanoparticles.

The ink may include ink for forming a quantum dot thin-film layer.

Another exemplary embodiment of the invention provides a method of measuring a volume of an ink droplet including: dropping an ink droplet on a substrate; irradiating light having a plurality of wavelengths by a chromatic confocal sensor to the ink droplet dropped on the substrate and scanning the ink droplet; and calculating a three-dimensional shape of the ink droplet from a signal scanned by the chromatic confocal sensor.

A plurality of the ink droplets may be dropped on the substrate.

The chromatic confocal sensor may scan the plurality of ink droplets to calculate a three-dimensional shape for each of the plurality of ink droplets.

The ink droplet may include nanoparticles.

The ink may include ink for forming a quantum dot thin-film layer.

Another exemplary embodiment provides a method of manufacturing a display apparatus including forming a plurality of light-emitting devices on a first substrate, forming a plurality of quantum dot thin-film layers on a second substrate, and sealing the first substrate and the second substrate such that the plurality of emission devices and the plurality of quantum dot thin-film layers correspond to each other. The forming of the quantum dot thin-film layers includes: dropping an ink droplet for forming the quantum dot thin-film layer on a test substrate by using a nozzle of an inkjet head; scanning and irradiating light having a plurality of wavelengths by a chromatic confocal sensor on the ink droplet dropped on the test substrate; obtaining a three-dimensional shape of the ink droplet from a signal scanned by the chromatic confocal sensor to feedback-control an ejection amount of the nozzle; and dropping the feedback-controlled ink droplet on the second substrate to be the quantum dot thin-film layer.

A plurality of the nozzle may be provided to drop a plurality of ink droplets on the test substrate.

The chromatic confocal sensor may scan the plurality of ink droplets to calculate a three-dimensional shape for each of the plurality of ink droplets and feedback-control an ejection amount of each of the plurality of nozzles.

The ink droplet may include nanoparticles.

The second substrate and the test substrate may be respectively mounted on different stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
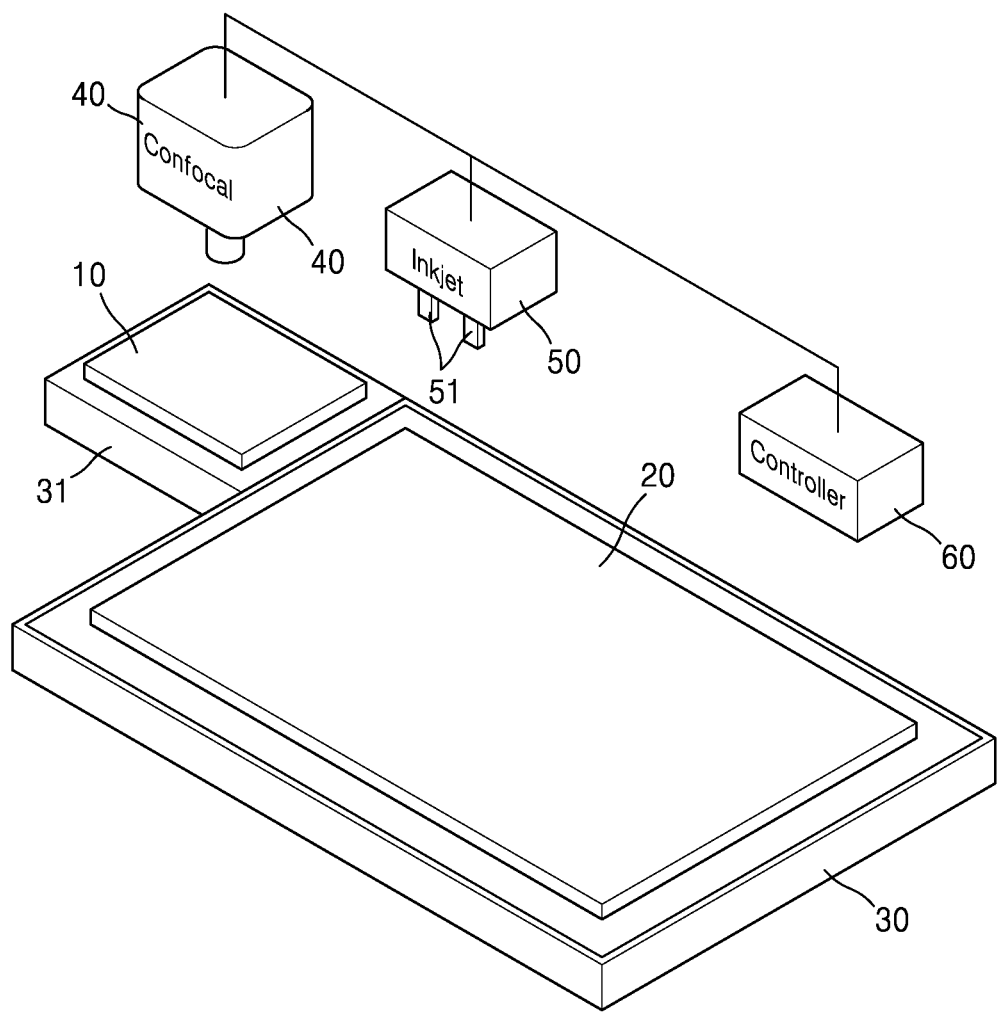
FIG. 1 is a schematic cross-sectional view of a configuration of a thin film layer forming apparatus including an ink droplet volume measuring apparatus according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of a configuration of a thin film layer forming apparatus including an ink droplet volume measuring apparatus according to an exemplary embodiment.

The ink droplet volume measuring device includes: a test substrate 10 on an auxiliary stage 31; a chromatic confocal sensor 40 that measures a volume of an ink droplet that is dropped from a nozzle 51 of an inkjet head 50 to the test substrate 10; and a controller 60 that compares a value measured by the chromatic confocal sensor 40 with a reference value to feedback-control an ink ejection amount of the inkjet head 50. That is, a thin film layer forming operation is actually performed on a subject substrate 20 on a main stage 30, and the ink droplet volume measuring apparatus, before actually performing the thin film layer forming operation on the subject substrate 20, first measures, on the test substrate 10, whether an appropriate amount of ink droplets are dropped from a plurality of nozzles 51 of the inkjet head 50, and adjusts each of the nozzles to have an appropriate ejection amount.

The thin film layer forming apparatus, in addition to the ink droplet volume measuring apparatus, further includes the main stage 30 on which the subject substrate 20 is placed, the inkjet head 50 including the plurality of nozzles 51 that drop ink droplets, and the like. FIG. 1 shows a structure in which the inkjet head 50 has two nozzles 51, but the structure is merely an example, and more than the two illustrated nozzles 51 may be arranged in a plurality of rows.

Therefore, on the auxiliary stage 31, an ink droplet is dropped on the test substrate 10 by the nozzle 51 of the inkjet head 50, a volume of the ink droplet is measured by the ink droplet volume measuring apparatus, the controller 60 feedback-controls and adjusts an ejection amount of each nozzle 51 to drop an ink droplet of a desired volume. After setting is completed, the thin film layer forming operation is actually performed on the subject substrate 20 of the main stage 30 by the nozzle 51 of the inkjet head 50. Accordingly, the thin film layer is formed on the subject substrate 20 by using the inkjet head 50, which is set in advance to drop an ink droplet having an accurate volume, and a fine thin film layer may be formed.

However, the fine thin film layer may be formed only when the ink droplet volume measuring apparatus accurately measures a volume of an ink droplet. As mentioned above, in the related art, when a bottom surface width of a dropped ink droplet is used to calculate a volume of the ink droplet as an approximate estimated value, there is a great difference between the estimated value and an actual volume of the ink droplet. Furthermore, the estimated value is calculated based on the assumption that the ink droplet is a hemisphere, but the actual ink droplet is not a perfect hemisphere and may be a shape having a dent spot. Therefore, the difference between the estimated value and the actual volume of the ink droplet further increases.

In the present exemplary embodiment, a volume of an ink droplet is measured by using the chromatic confocal sensor 40, as described above.

Figure 2:
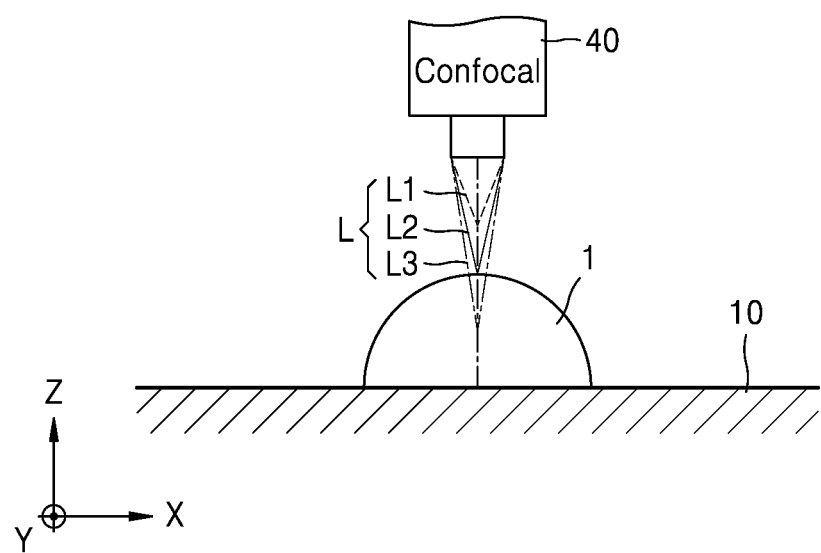
FIG. 2 and FIG. 3 are respectively a side view and a top-plan view showing a volume measuring principle of the ink droplet volume measuring apparatus shown in FIG. 1.
Figure 3:
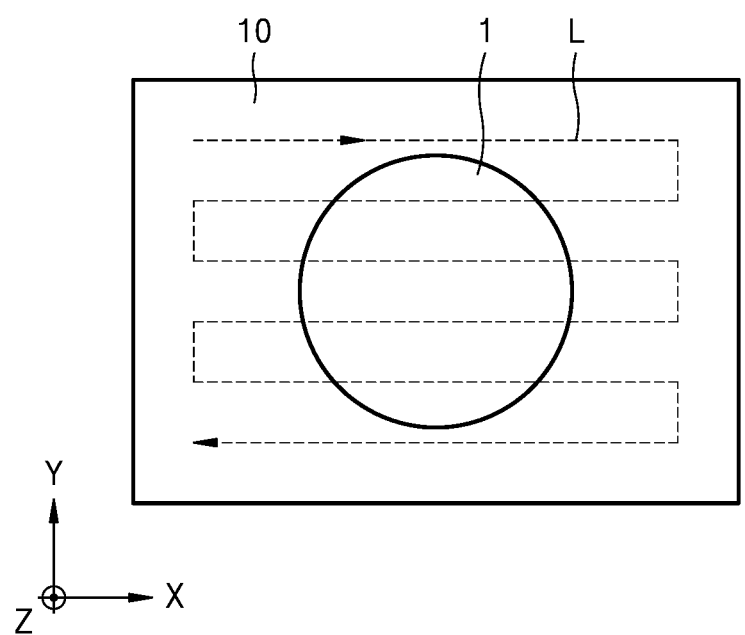

FIGS. 2 and 3 are respectively a side view and a plan view schematically showing a principle of measuring a volume of an ink droplet 1 by using the chromatic confocal sensor 40.

First, referring to FIG. 2, the chromatic confocal sensor 40 irradiates light L onto the ink droplet 1 and receives reflected light to identify a position of a surface. In this case, the chromatic confocal sensor 40 does not irradiate light of a single wavelength but instead simultaneously irradiates light having a plurality of wavelengths L1, L2, and L3. In the present exemplary embodiment, a case in which the light has three wavelengths L1, L2, and L3 are shown to provide a brief example, but light having a greater number of wavelengths may be simultaneously irradiated. By doing so, reflected light of light of a wavelength which is accurately focused on the surface of the ink droplet 1 is received, and a distance from the test substrate 10 to the surface of the ink droplet 1, that is, a position in the Z direction, may be identified.

Accordingly, as shown in FIG. 3, when the chromatic confocal sensor 40 scans the ink droplet on an X-Y plane and collects positions of spots in a Z axis direction, a three-dimensional shape of the ink droplet 1 is obtained.

Since the three-dimensional shape obtained in this way is a result of directly measuring the shape of the ink droplet 1, by calculating a volume based on the three-dimensional shape, an accurate volume of the ink droplet 1 may be obtained. In FIG. 1, only one ink droplet 1 is shown. However, as each of the plurality of nozzles drop one ink droplet, the light L of the chromatic confocal sensor L passes scanning above all the ink droplets dropped on the test substrate 10, a three-dimensional shape and a volume may be obtained for each ink droplet 1.

Volume measurement values of the ink droplets obtained by this method is transmitted to the controller 60, and the controller 60 compares the values with a reference value, increases or decreases an ejection amount from each nozzle 51, and feedback-controls such that each of the nozzles 51 ejects an ink droplet 1 having an appropriate volume. The feedback-control operation may be performed one or more times until the ink droplets 1 each have an appropriate volume.

Accordingly, a thin-film layer is formed by adjusting the ejection amount of each nozzle 51 based on accurate volume measurement values of the ink droplets 1, and thus, a thin-film layer, such as a quantum dot thin-film layer, may be very uniformly formed in a desired thickness.

Before describing a process of manufacturing a quantum dot thin-film layer by using the thin-film forming apparatus which includes the ink droplet volume measuring apparatus, a structure of the display apparatus having the quantum dot thin-film layer will be first described in detail with reference to FIG. 4.

Figure 4:
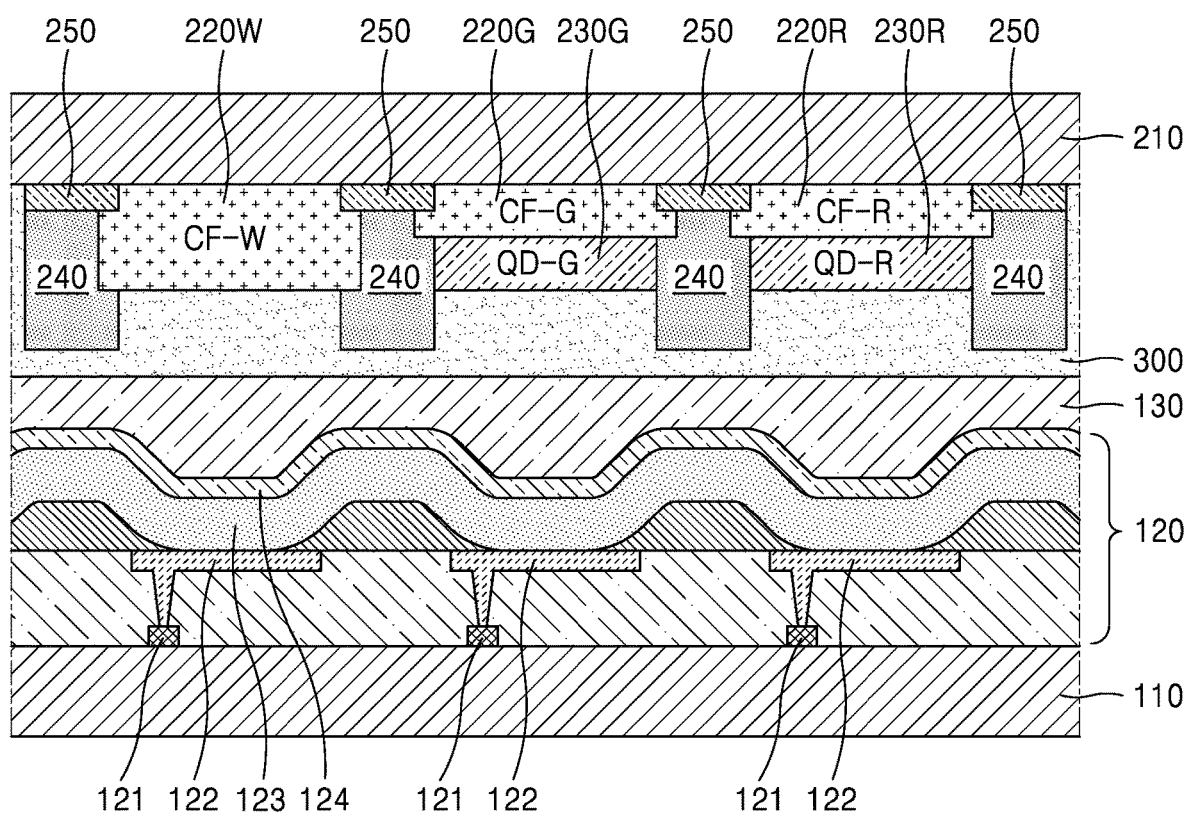
FIG. 4 is a cross-sectional view of a display apparatus that is manufactured by using the thin film layer forming apparatus shown in FIG. 1.

FIG. 4 is a cross-sectional view of the display apparatus having the quantum dot thin-film layer. Although FIG. 4 only shows only one set of red, green, and blue pixels, it may be understood that an actual product of the inventive concepts includes a plurality of sets of the red, green, and blue pixels.

As shown in FIG. 4, the structure of the display apparatus includes a first substrate 110, on which an organic light-emitting device 120 is arranged, a second substrate 210, on which quantum dot thin-film layers 230R and 230G and color filters 220R, 220G, and 220W as light-blocking units are arranged. The first substrate 110 and the second substrate 210 are sealed together with a filler 300 therebetween.

First, the organic light-emitting device 120 has a structure in which an organic emission layer 123 is arranged between an anode electrode 122 and a cathode electrode 124 and generates light according to a principle in which holes and electrons injected from the anode electrode 122 and the cathode electrode 124 recombine and emit light. In this case, in the organic light-emitting diode 120, all of the red, green, blue pixels generate the same blue light. That is, the organic light-emitting device 120 emits the same blue light, and the light-blocking unit of each pixel converts the blue light into red, green, and blue lights.

Reference numeral 121 denotes a pixel circuit connected to the anode electrode 122, wherein the pixel circuit includes elements such as a thin-film transistor and a capacitor. Reference numeral 130 denotes a thin-film encapsulation layer which covers and protects the organic light-emitting device. The thin-film encapsulation layer may be a single film including an organic material or an inorganic material, or alternatively, the thin-film encapsulation layer may be multiple films in which organic films and inorganic films are alternately stacked. The inorganic film may include silicon oxide, silicon nitride, and/or silicon oxynitride, and the organic film may include polyethylene terephthalate, polyethylene naphthalate, polycarbonate, polyimide, polyethylene sulfonate, polyoxymethylene, polyarylate, hexamethyldisiloxane, an acryl-based resin (for example, polymethyl methacrylate, polyacrylic acide, and the like), or an arbitrary combination thereof.

The light-blocking unit includes the quantum dot thin-film layers 230R and 230G and the color filters 220R, 220G, and 220W. The quantum dot thin-film layers 230R and 230G convert the blue light generated from the organic light-emitting diode 120 into a desired color, such as red or green, and the color filter layers 220R, 220G, and 220W filter stray light that may be partially mixed in the converted color to enhance color purity. Here, the red pixel and the green pixel include all of the quantum dot thin-film layers 230R and 230G and the color filters 220R and 220G, and on the contrary, the blue pixel only includes a white color filter layer 220W, for the light generated from the organic light-emitting diode 120 is blue light. In other words, since the blue pixel does not have to change the color of light and only transmits the light, the blue pixel only includes the white color filter layer 220W for filtering the stray light.

Reference numeral 250 denotes a black matrix arranged between the pixels for blocking lights, and reference numeral 240 denotes a bank for making a boundary between the light-blocking units of each pixel.

The filler 300 is between the first substrate 110 and the second substrate 210. The filler 300 functions as a gap maintenance unit for maintaining an appropriate gap between the first substrate 110 and the second substrate 210 and also functions as a bonding material. Accordingly, by applying the filler 300 between the first substrate 110 and the second substrate 210 and bonding the first substrate 110 and the second substrate 210 together, the filler 300 appropriately maintains the gap between the first substrate 110 and the second substrate 210 and firmly bonds the first substrate 110 and the second substrate 210 to each other.

As described above, the quantum dot thin-film layers 230R and 230G may be formed by dropping ink droplets by using the inkjet head. Quantum dots or cores, which are light color conversion particles included in the ink for forming the quantum dot thin film layers 230R and 230G, may be selected from a Group II-VI compound, a Group III-V compound, a Group IV-VI compound, a Group IV element, a Group IV compound, and a combination thereof.

A Group II-VI compound may be selected from among: a two-element compound selected from among CdSe, CdTe, ZnS, ZnSe, ZnTe, ZnO, HgS, HgSe, HgTe, MgSe, MgS, and a combination thereof; a three-element compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a four-element compound selected from among HgZnTes, CdZnSeS, CdZnSeTe, CdZnSTe, CdHgSeS, CdHgSeTe, CdHgSTe, HgZnSeS, HgZnSeTe, HgZnSTe, and a combination thereof.

A Group III-V compound may be selected from among: a two-element compound selected from among GaN, GaP, GaAs, GaSb, AlN, AlP, AlAs, AlSb, InN, InP, InAs, InSb, and a combination thereof; a three-element compound selected from among GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof; and a four-element compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

A Group IV-VI compound may be selected from among: a two-element compound selected from among SnS, SnSe, SnTe, PbS, PbSe, PbTe, and a combination thereof; a three-element compound selected from among SnSeS, SnSeTe, SnSTe, PbSeS, PbSeTe, PbSTe, SnPbS, SnPbSe, SnPbTe, and a combination thereof; and a four-element compound selected from among SnPbSSe, SnPbSeTe, SnPbSTe, and a combination thereof. A Group IV element may be selected from among Si, Ge, and a combination thereof. A Group IV compound may include a two-element compound selected from among SiC, SiGe, and a combination thereof.

In this case, the two-element compound, the third-element compound, and the four-element compound may be included in particles in uniform concentrations, or be in a the same particle in a state of being partially divided according to different concentrations. The quantum dot may also have a core-shell structure in which a quantum dot surrounds another quantum dot. An interface between the core and the shell may have a concentration gradient in which a concentration of an element in the shell decreases toward a center.

In some exemplary embodiments, the quantum dot may have a core-shell structure including a core, which includes nanocrystals, and a shell that surrounds the core. The shell of the quantum dot may function as a protective layer for preventing chemical change of the core and maintain properties of the semiconductor and/or a charging layer for giving an electrophoretic property to the quantum dot. The shell may include a single layer or multiple layers. An interface between the core and the shell may have a concentration gradient in which a concentration of an element in the shell decreases toward a center. The shell in the quantum dot may include, for example, an oxide of a metal or non-metal, a semiconductor compound, or a combination thereof.

For example, the oxide of metal or non-metal may include a two-element compound, such as $SiO_2$, $Al_2O_3$, $TiO_2$, ZnO, $Mn_2O_3$, $Mn_3O_4$, MnO, CuO, FeO, $Fe_2O_3$, $Fe_3O_4$, CoO, $Co_3O_4$, NiO, or a three-element compound such as $MgAl_2O_4$, $CoFe_2O_4$, $NiFe_2O_4$, or $CoMn_2O_4$, but the inventive concepts are not limited thereto.

The semiconductor compound may include, for example, Cds, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the inventive concepts are not related thereto.

The quantum dot may have a full width of half maximum (FWHM) of about 45 nm or less, preferably about 40 nm or less, more preferably about 30 nm or less, and color purity or color gamut may be enhanced in the above-mentioned range. In addition, as light emitted from the quantum dot is irradiated in all directions, a field angle of light may widen.

In addition, the shape of a quantum dot is commonly used in the technical field and is not particularly limited. However, more specifically, the shape of a quantum dot may include a sphere, a pyramid shape, a multi-arm shape or a cubic-shape nano particle, nano tube, nano wire, nano fabric, nano laminar particle, and the like.

The quantum dot may adjust the color of emitted light according to sizes of particles, and therefore, the quantum dot may have various emission colors, such as blue, red, and green.

As described above, the ink for forming the quantum dot thin-film layers 230R and 230G may contain nanoparticles, and the light irradiated from the chromatic confocal sensor 40 may be partially scattered due to the nanoparticles. However, as described above, the chromatic confocal sensor 40 irradiates the light having various wavelengths L1, L2, and L3. Therefore, the scattering has a very small influence. In other words, light having a single wavelength, such as laser light, may have a great measurement error when the light is scattered due to nanoparticles. However, since the chromatic confocal sensor 40 irradiates the light having the various wavelengths L1, L2, and L3 and measures the reflected light, the influence of the scattering breaks up and the scattering has a minimal influence on the measurement.

The display apparatus, including the quantum dot thin-film layers 230R and 230G having the above-mentioned structure, may be manufactured in a process as shown in FIGS. 5A through 5E.

Figure 5A:
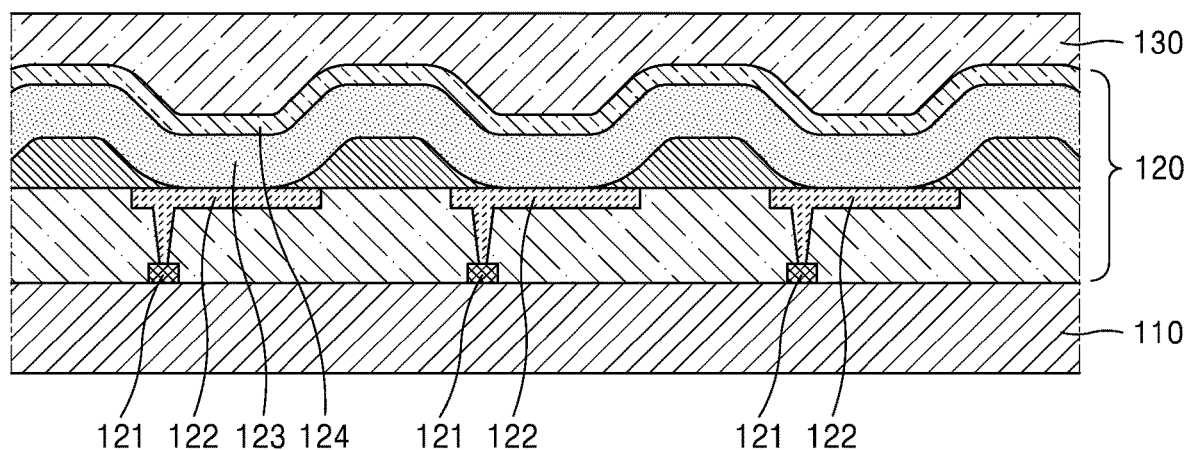
FIGS. 5A, 5B, 5C, 5D, and 5E are cross-sectional views sequentially showing a process of manufacturing the display apparatus shown in FIG. 4.

First, as shown in FIG. 5A, the organic light-emitting diodes 120 are formed on the first substrate 110 and covered by the thin-film encapsulation layer 130.

Figure 5B:
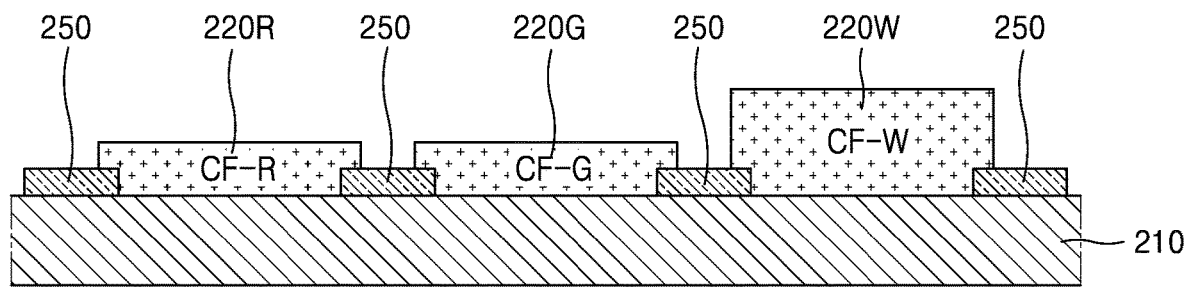

As shown in FIG. 5B, the black matrix 250 and the color filter layers 220R, 220G, and 220W are respectively formed on the second substrate 210 in a photolithography process. The color filter layers 220R, 220G, and 220W are formed to respectively correspond to the organic light-emitting diodes 120.

Figure 5C:
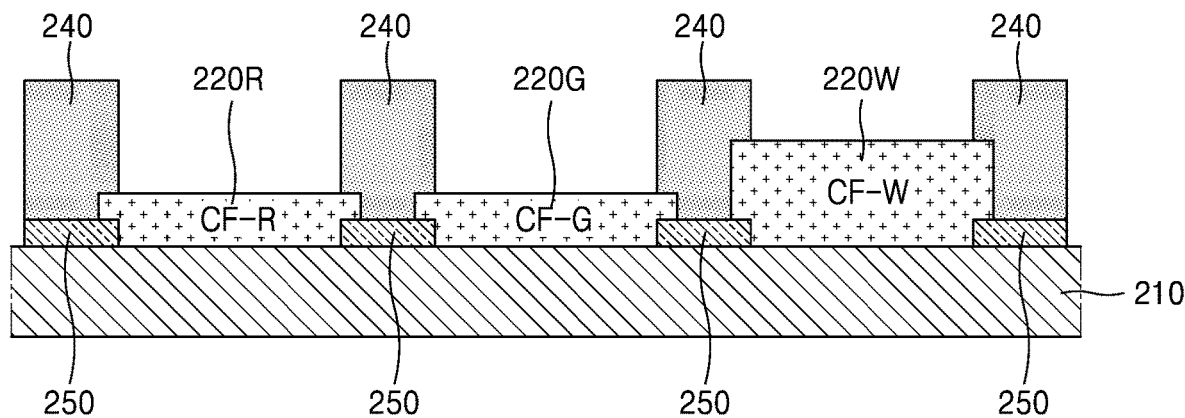

Next, the bank 240 is formed to build a boundary between the pixels, as shown in FIG. 5C. The bank 240 may include a complex polymer, perfluoro polyether (PFPE), acryl, silicon, epoxy, or the like.

Figure 5D:
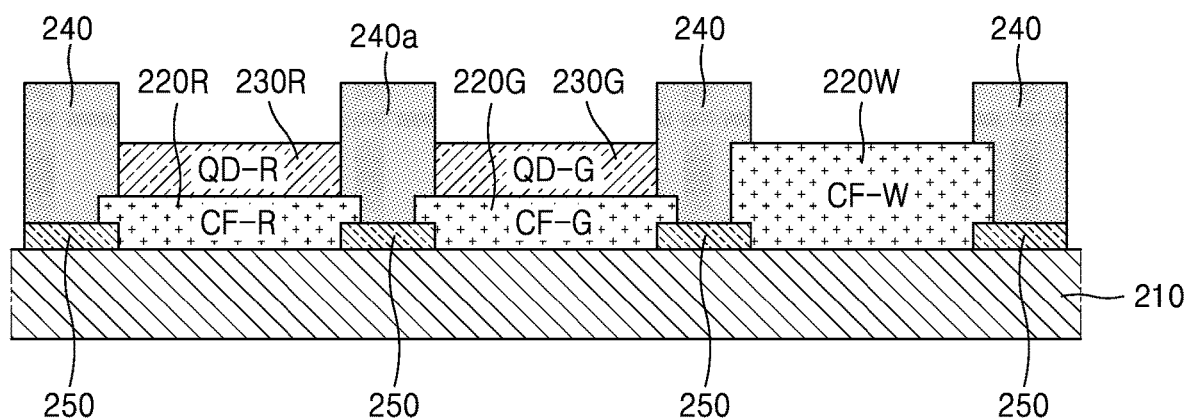

Next, as shown in FIG. 5D, the quantum dot thin-film layers 230R and 230G are selectively formed only in the red pixel and the green pixel except the blue pixel. The quantum dot thin-film layers 230R and 230G are formed at positions to respectively overlap the color filter layers 220R and 220G.

In this case, the nozzles 51 of the inkjet head 50 drop ink droplets 1 at positions respectively overlapping the color filters 220R and 220G to form the quantum dot thin-film layers 230R and 230G. That is, the target substrate 20 described with reference to FIG. 1 is the second substrate 210 including the color filters 220R and 220G when manufacturing the display apparatus. The second substrate 210 is mounted on the main stage 30, a volume of the ink droplet 1 dropped on the test substrate 10 is measured by using the ink droplet volume measuring apparatus to adjust an ejection amount of each nozzle 51, and ink droplets 1 having accurate volumes are dropped on the second substrate 210 to form the quantum dot thin-film layers 230R and 230G. Accordingly, the quantum dot thin-film layers 230R and 230G having very uniform thicknesses may be formed.

Figure 5E:
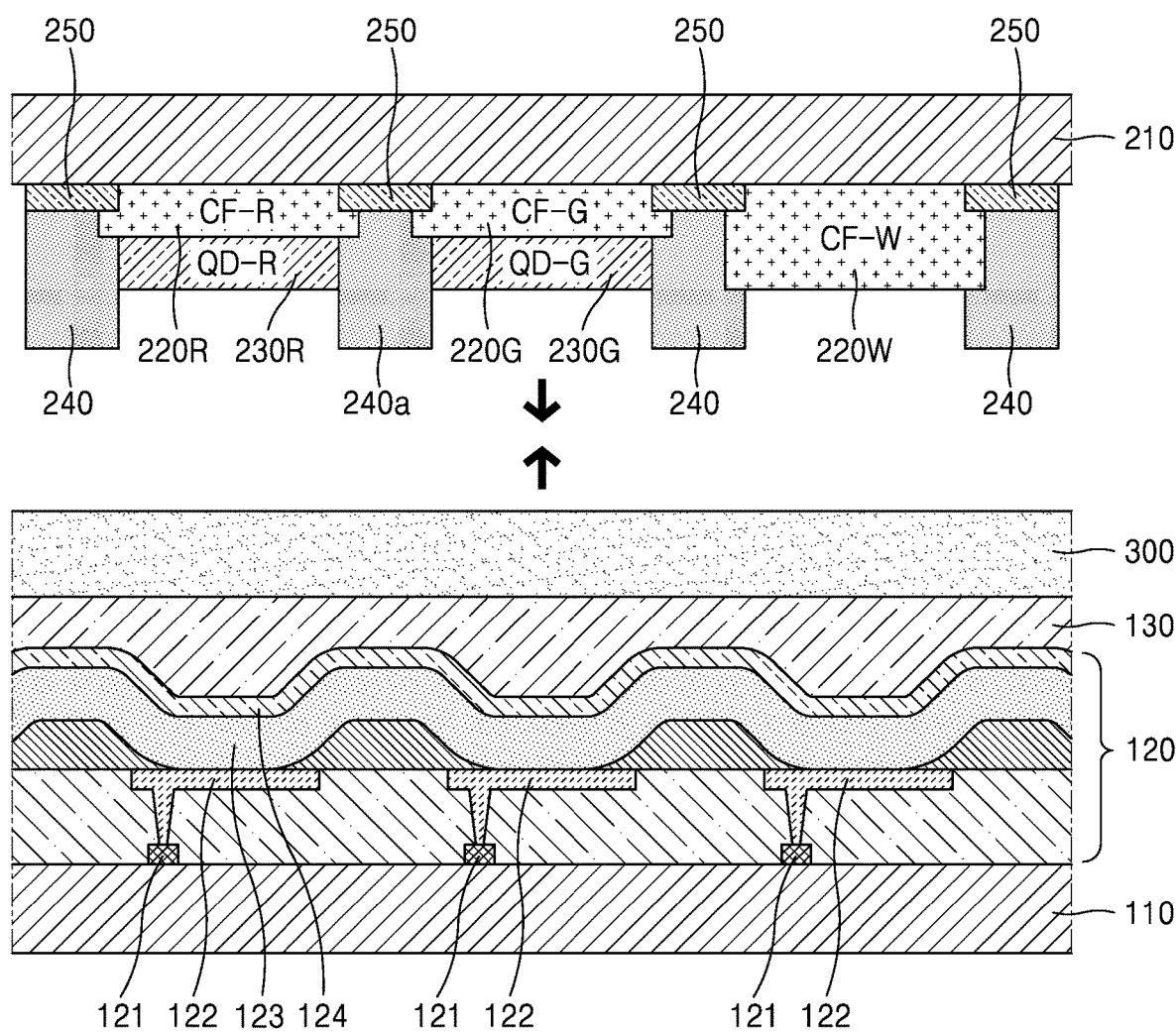

After forming the quantum dot thin-film layers 230R and 230G, as shown in FIG. 5E, the filler 300 is applied between the first substrate 110 and the second substrate 210, and the first substrate 110 and the second substrate 210 are bonded to each other. By doing so, as shown in FIG. 4, the display apparatus in which the organic light-emitting device 120, the quantum dot thin-film layers 230R and 230G, and the color filter layers 220R, 220G, and 220W are realized.

The present exemplary embodiment shows a case in which the organic light-emitting diode 120 and the organic emission layer 123 are each formed as a common layer over an entire pixel area, but the organic light-emitting diode 120 and the organic emission layer 123 may be separately formed for each pixel. That is, the organic emission layer 123 may be formed as a common layer or separately formed for each pixel.

Therefore, as described above, by using the ink droplet volume measuring apparatus, the method of measuring the ink droplet volume, and the method of forming a quantum dot thin-film layer of the display apparatus, a volume of an actual ink droplet may be more precisely measured, feedback-control may be precisely performed, and therefore, stable quality and high productivity may be secured.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display apparatus, the method comprising:
   forming a plurality of emission devices on a first substrate;
   forming a plurality of quantum dot thin-film layers on a second substrate; and
   sealing the first substrate and the second substrate such that the plurality of emission devices and the plurality of quantum dot thin-film layers correspond to each other,
   wherein the forming of the quantum dot thin-film layers comprises:
      dropping ink droplet for forming the quantum dot thin-film layer on a test substrate by using a nozzle of an inkjet head,
      scanning and irradiating light having a plurality of wavelengths by a chromatic confocal sensor on the ink droplet dropped on the test substrate;
      obtaining a three-dimensional shape of the ink droplet from a signal scanned by the chromatic confocal sensor to feedback-control an ejection amount of the nozzle; and
      dropping the feedback-controlled ink droplet on the second substrate to be the quantum dot thin-film layer.

2. The method of claim 1, wherein a plurality of the nozzles are provided to drop a plurality of ink droplets on the test substrate.

3. The method of claim 2, wherein the chromatic confocal sensor scans the plurality of ink droplet to obtain a three-dimensional shape for each of the plurality of ink droplets and feedback-controls an ejection amount of each of the plurality of nozzles.

4. The method of claim 1, wherein the ink droplet comprises nanoparticles.

5. The method of claim 1, wherein the second substrate and the test substrate are respectively mounted on different stages.

* * * * *